United States Patent
Chang et al.

(10) Patent No.: US 8,829,575 B2
(45) Date of Patent: Sep. 9, 2014

(54) SEMICONDUCTOR STRUCTURE AND PROCESS THEREOF

(71) Applicant: United Microelectronics Corp., Hsin-Chu (TW)

(72) Inventors: Chung-Fu Chang, Tainan (TW); Yu-Hsiang Hung, Tainan (TW); Chia-Jong Liu, Ping-Tung County (TW); Yen-Liang Wu, Taipei (TW); Pei-Yu Chou, Tainan (TW); Home-Been Cheng, Keelung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 62 days.

(21) Appl. No.: 13/727,540

(22) Filed: Dec. 26, 2012

(65) Prior Publication Data

US 2014/0175527 A1   Jun. 26, 2014

(51) Int. Cl.
*H01L 29/78* (2006.01)
(52) U.S. Cl.
USPC ............ 257/288; 438/199
(58) Field of Classification Search
USPC .................. 257/288
See application file for complete search history.

(56) References Cited

U.S. PATENT DOCUMENTS

| 8,174,071 B2 * | 5/2012 | Tien et al. ............. 257/343 |
| 2009/0273029 A1 * | 11/2009 | Tien et al. ............. 257/336 |
| 2011/0147810 A1 | 6/2011 | Hsu |
| 2013/0203228 A1 * | 8/2013 | Hsu et al. ............. 438/264 |
| 2014/0087535 A1 * | 3/2014 | Roh et al. ............. 438/285 |

OTHER PUBLICATIONS

H.Ohta, High Performance 30 nm Gate Bulk CMOS for 45 nm Node with Σ-shaped SiGe-SD, 2005.

* cited by examiner

*Primary Examiner* — Thao P Le
(74) *Attorney, Agent, or Firm* — Winston Hsu; Scott Margo

(57) ABSTRACT

A semiconductor structure includes a gate, a dual spacer and two recesses. The gate is located on a substrate. The dual spacer is located on the substrate beside the gate. The recesses are located in the substrate and the dual spacers, wherein the sidewall of each of the recesses next to the gate has a lower tip and an upper tip, and the lower tip is located in the substrate while the upper tip is an acute angle located in the dual spacer and close to the substrate. The present invention also provides a semiconductor process formed said semiconductor structure.

20 Claims, 5 Drawing Sheets

SEMICONDUCTOR STRUCTURE AND PROCESS THEREOF

BACKGROUND OF THE INVENTION

1. Field of the Invention

The present invention relates generally to a semiconductor structure and process thereof, and more specifically to a semiconductor structure and process thereof that forms recesses in a substrate and a dual spacer.

2. Description of the Prior Art

For decades, chip manufacturers have made metal-oxide-semiconductor (MOS) transistors faster by making them smaller. As the semiconductor processes advance to the very deep sub micron era such as 65-nm node or beyond, how to increase the driving current for MOS transistors has become a critical issue in the field. In order to improve device performance, crystal strain technology has been developed. By putting a strain on a semiconductor crystal, the speed at which charges move through that crystal is altered. Strain makes MOS transistors work better by enabling electrical charges, such as electrons, to pass more easily through the silicon lattice of the gate channel.

Attempts have been made to develop a strained silicon layer, which has been grown epitaxially on a silicon substrate with a silicon germanium (SiGe) epitaxial structure or a silicon carbide (SiC) epitaxial structure disposed therebetween. In this type of MOS transistor, a biaxial tensile strain occurs in the epitaxy silicon structure due to the silicon germanium or silicon carbide epitaxial structure which has a larger or smaller lattice constant than silicon. As a result, the band structure alters, and the carrier mobility increases, which enhances the speed performance of the MOS transistors. Furthermore, the sizes, shapes of the epitaxial structures and the distances between the epitaxial structures and a gate structure of the MOS transistor etc will affect stresses induced by the epitaxial structures in a gate channel, which affects the speed of the MOS transistor. The structure, type and material properties of the gate paired with the epitaxial structures will also affect the electrical performance.

SUMMARY OF THE INVENTION

The present invention therefore provides a semiconductor structure and process thereof, which forms recesses in a substrate and a dual spacer, enabling shapes of epitaxial structures formed in the recesses to be changed. Thereby, the efficacy of the epitaxial structures can be improved.

The present invention provides a semiconductor structure including a gate, a dual spacer and two recesses. The gate is located on a substrate. The dual spacer is located on the substrate beside the gate. The two recesses are located in the substrate and the dual spacer, wherein the sidewall of each of the recesses next to the gate has a lower tip and an upper tip, and the lower tip is located in the substrate while the upper tip is an acute angle, located in the dual spacer and directly next to the substrate.

The present invention provides a semiconductor process including the following steps. A gate is formed on a substrate. A dual spacer is formed on the substrate beside the gate. An etching process is performed on the substrate and the dual spacer to form two recesses in the substrate and the dual spacer beside the gate, wherein the sidewall of each of the recesses next to the gate has a lower tip and an upper tip, and the lower tip is located in the substrate while the upper tip is an acute angle, located in the dual spacer and directly next to the substrate.

According to the above, the present invention provides a semiconductor structure and process thereof, which forms recesses in a substrate and a dual spacer, wherein each of the recesses has an upper tip in the dual spacer and a lower tip in the substrate, so that stresses in a gate channel induced by epitaxial structures later formed in the recesses can be increased and the efficacy of the epitaxial structures can thereby be improved.

These and other objectives of the present invention will no doubt become obvious to those of ordinary skill in the art after reading the following detailed description of the preferred embodiment that is illustrated in the various figures and drawings.

DETAILED DESCRIPTION

The semiconductor process of the present invention is applied in a gate last for high-K last, buffer layer last process in the following embodiments, but the present invention is not restricted to this. In another embodiment, the present invention may also be applied in a gate last for high-K last, buffer layer first process, agate last for high-K first, buffer layer first process, agate first process or a polysilicon gate process, etc.

Figure 1:
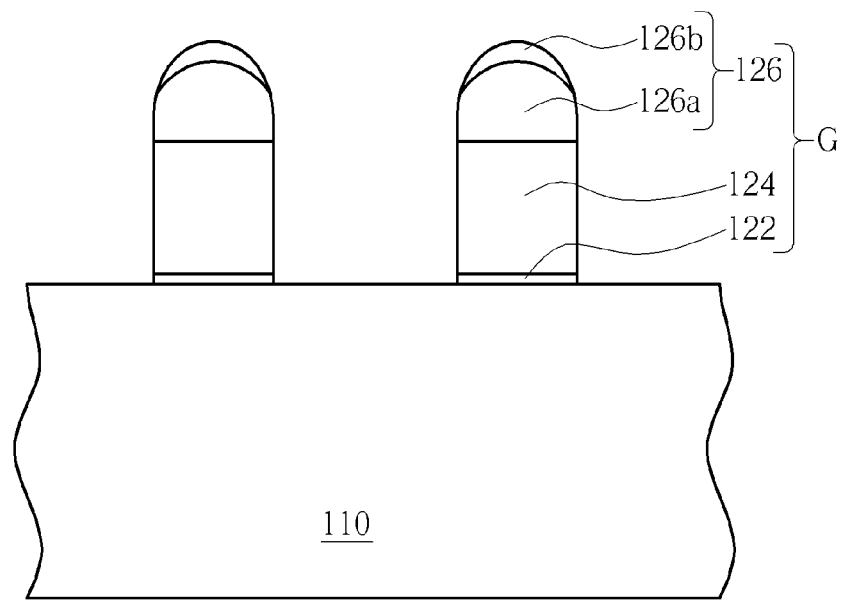
FIGS. 1-10 schematically depict cross-sectional views of a semiconductor process according to an embodiment of the present invention.

FIGS. 1-10 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

A gate dielectric layer (not shown), a sacrificial electrode layer (not shown) and a cap layer (not shown) are sequentially formed from bottom to top and cover the substrate 110. The cap layer (not shown), the sacrificial electrode layer (not shown) and the gate dielectric layer (not shown) are patterned to form a gate dielectric layer 122, a sacrificial electrode layer 124 and a cap layer 126 on the substrate 110. This means that sacrificial gates G including the gate dielectric layer 122, the sacrificial electrode layer 124 and the cap layer 126 are formed. Due to a gate last for high-K last, buffer layer last process being applied in this embodiment, the gate dielectric layer 122 and the sacrificial electrode layer 124 will be removed in later processes, so that the gate dielectric layer 122 may just be an oxide layer, which may be formed by a thermal oxide process or a chemical oxide process, and the sacrificial electrode layer 124 may be a polysilicon electrode layer, but is not limited thereto. In this embodiment, the cap layer 126 includes a bottom cap layer 126a and a top cap layer 126b stacked from bottom to top. The bottom cap layer 126a and the top cap layer 126b preferably has different etching selectivities, meaning the etching rate of an etching process with respect to the bottom cap layer 126a is different from the top cap layer 126b; for example, the bottom cap layer 126a is a nitride layer while the top cap layer 126b is an oxide layer, but is not limited thereto. Due to a gate last for high-K last, buffer layer last process being applied in this embodiment, the formed gate is a sacrificial gate G, and at least part of the sacrificial gate G will be replaced in later processes. In another embodiment, as a gate first process or a polysilicon process is applied, the formed gate may be a metal gate or a polysilicon gate; neither will be removed in later processes. Furthermore, isolation structures (not shown) are formed in the substrate 110 to electrically isolate each transistor. The isolation structure (not shown) may be a shallow trench isolation (STI) structure, which may be formed by a shallow trench isolation process; the forming method is known in the art and therefore will not be described herein. Please note the present invention is not limited thereto.

Figure 2:
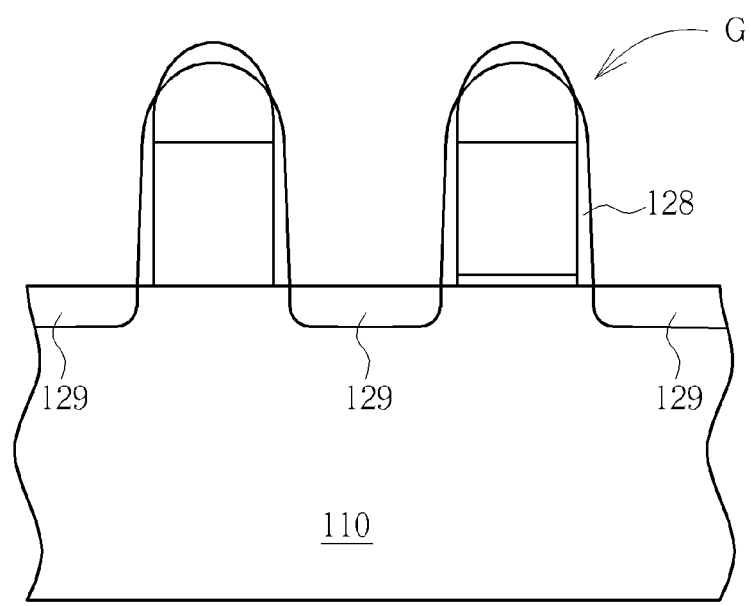

As shown in FIG. 2, a first spacer 128 is formed on the substrate 110 beside each of the sacrificial gate G. In this embodiment, the first spacer 128 may be a silicon carbonnitride spacer; in another embodiment, the first spacer 128 may be a single layer or a multilayer structure composed of materials such as silicon nitride or silicon oxide, etc. A lightly doped ion implantation process is performed to form a lightly doped source/drain region 129 in the substrate 110 beside the first spacer 128, wherein the dopants of the lightly doped source/drain region 129 may be trivalent ions or pentavalent ions such as boron or phosphorus, etc.

Figure 3:
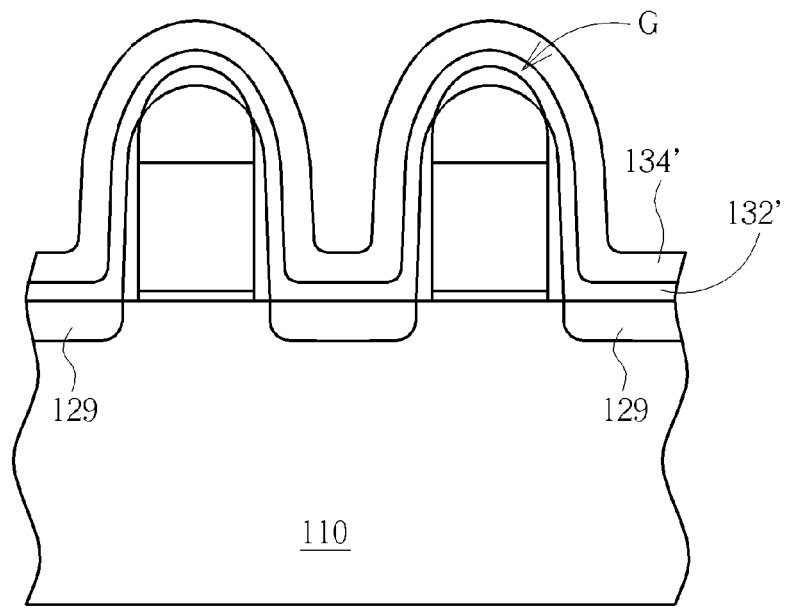
Figure 4:
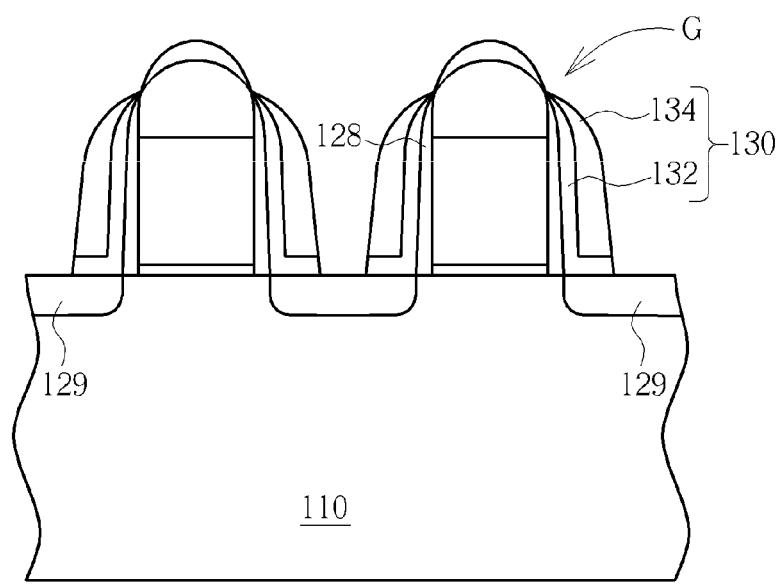

As shown in FIG. 3, an internal spacer material 132' and an outer spacer material 134' are sequentially formed to cover the substrate 110 and the sacrificial gate G. As shown in FIG. 4, the internal spacer material 132' and the outer spacer material 134' are etched to form dual spacers 130, and each of them including an internal spacer 132 and an outer spacer 134. By doing this, the internal spacer 132 in this embodiment will have an L-shaped cross-sectional profile. In this embodiment, the internal spacer material 132' is oxide and the outer spacer material 134' is nitride, so that the internal spacer 132 is an oxide spacer and the outer spacer 134 is a nitride spacer, but the invention is not limited thereto, and depends upon etchants of the later performed etching process and the desired structure.

Figure 5:
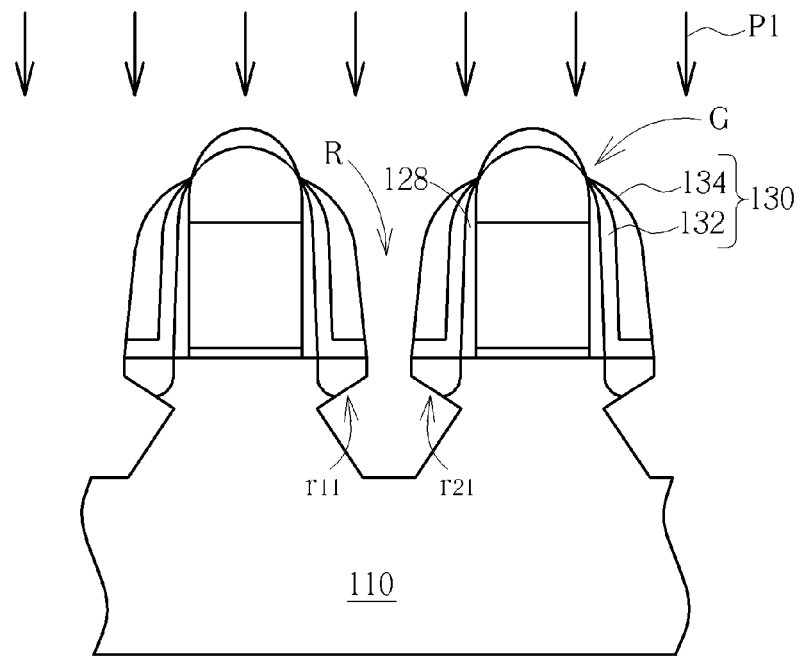
Figure 6:
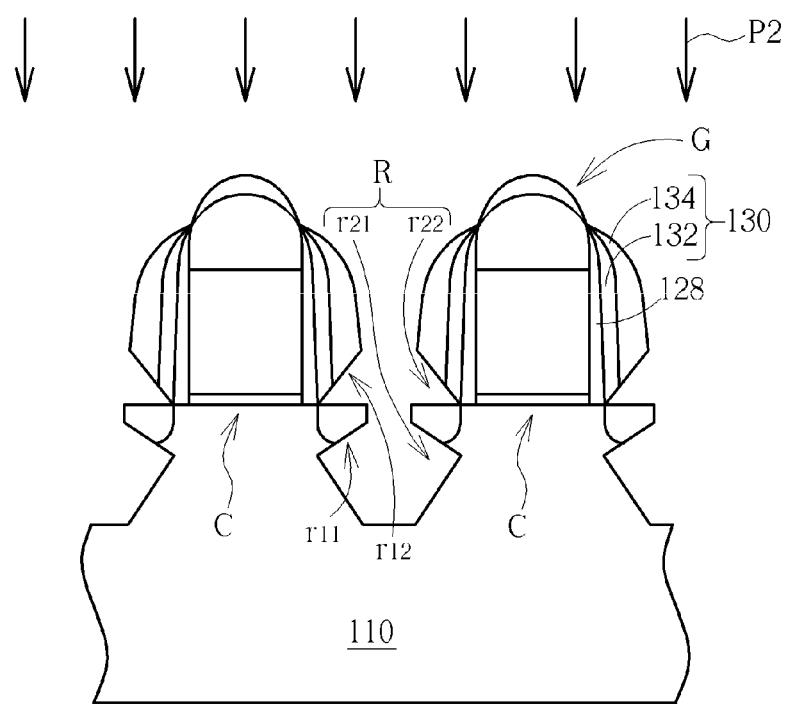

As shown in FIGS. 5-6, an etching process (including a first etching process P1 and a second etching process P2) is performed on the substrate 110 and the dual spacer 130 to form recesses R in the substrate 110 and the dual spacer 130 beside the sacrificial gate G. In this embodiment, the etching process may be a wet etching process, which may be a dilute hydrofluoric acid (DHF) containing wet etching process or other wet etching processes with acid etchants, but is not limited thereto. In another embodiment, the etching process may include dry etching processes or/and wet etching processes etc. The etching process may include a single etching process or a plurality of etching processes, and part of the substrate 110 and the dual spacer 130 may be etched respectively by each of the etching processes or the shapes or profiles of the recesses R1 and R2 may be optimized by a plurality of etching processes. For example, as shown in FIG. 5, the first etching process P1 is performed to etch the substrate 110 beside the dual spacer 130 to respectively form lower tips r11 and r21 of the recesses R. Then, as shown in FIG. 6, the second etching process P2 is performed to etch the dual spacer 130 right next to the substrate 110 to form upper tips r12 and r22 of the recesses R. Therefore, the recesses R located in the substrate 110 and the dual spacer 130 beside the sacrificial gate G are formed, wherein the upper tips r12 and r22 and the lower tips r11 and r21 are preferably acute angles, so that stresses in gate channels C induced by epitaxial structures formed in the recesses R can later be increased. In this embodiment, the first etching process P1 and the second etching process P2 may both be a wet etching process, which may be a dilute hydrofluoric acid (DHF) containing wet etching process or other wet etching processes with acid etchants, but not limited thereto. As the lower tips r11 and r21 of the recesses R in the substrate 110 are etched by the first etching process P1 and the upper tips r12 and r22 of the recesses R in the dual spacer 130 are etched by the second etching process P2, the etchants of the first etching process P1 and the second etching process P2 can be individually chosen in accordance with the materials of the substrate 110 and the dual spacer 130.

More precisely, the second etching process P2 applied in this embodiment should comply with the following conditions for controlling the shapes of the recesses R accurately. In this embodiment, the etching rate of the second etching process P2 with respect to the internal spacer 132 is larger than with respect to the outer spacer 134, meaning the etching rate of the second etching process P2 in this embodiment with respect to the oxide spacer (meaning the internal spacer 132) should be larger than the nitride spacer (meaning the outer spacer 134); however, the invention is not limited thereto, and depends upon the materials and the desired formed shapes of the internal spacer 132 and the outer spacer 134. The upper tips r12 and r22 with acute angles are formed, enabling stresses in the gate channels C induced by epitaxial structures formed later in the recesses R to be increased. In a preferred embodiment, the etching rate of the second etching process P2 with respect to the internal spacer 132 is much larger than with respect to the substrate 110, so that the upper tips r12 and r22 right next to the substrate 110 can be prevented from merging together with the lower tips r11 and r21 due to over-etching of the substrate 110. In this embodiment, due to the internal spacer 132 being an oxide spacer and the substrate 110 being a silicon substrate, the etching rate of the second etching process P2 with respect to oxide is larger than with respect to silicon, but the invention is not limited thereto, and depends upon the materials of the internal spacer 132 and the substrate 110 and the desired shapes of the recesses R1 and R2. Furthermore, the etching rate of the second etching process P2 with respect to the internal spacer 132 is much larger than with respect to the first spacer 128. In this way, as the internal spacer 132 is etched by the second etching process P2, the first spacer 128 is also etched. Therefore, the first spacer 128 becoming thinner or even being etched through, leading the sacrificial gate G to be exposed, can be prevented. An increase in circuit leakage of a formed semiconductor component such as a transistor can therefore also be avoided.

In this embodiment, the first etching process P1 is performed to etch the substrate 110 beside the dual spacer 130, so that the lower tips r11 and r21 are formed; then, the second etching process P2 is performed to etch the dual spacer 130, so that the upper tips r12 and r22 are formed. In another embodiment, the upper tips r12 and r22 and the lower tips r11 and r21 may be formed simultaneously by single process, but the invention is not limited thereto.

Figure 7:
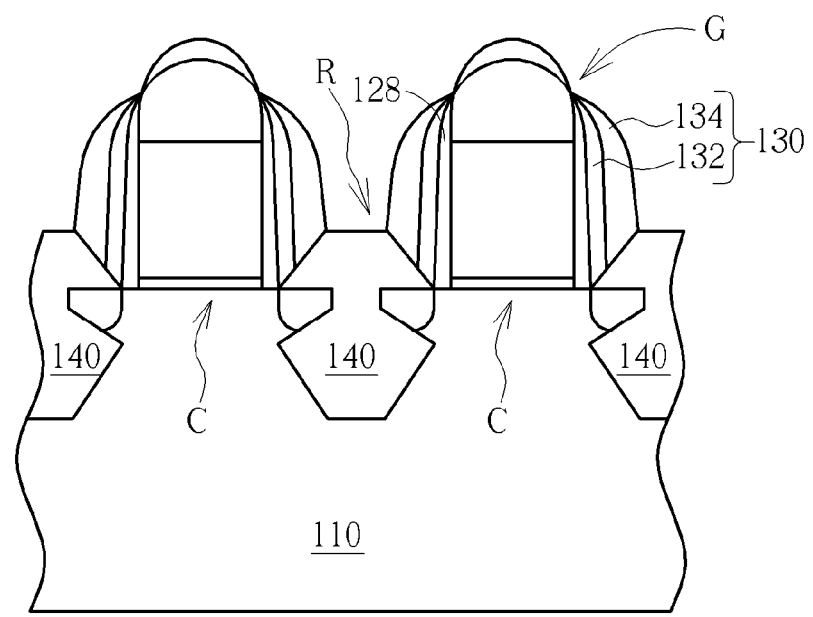

An epitaxial structure 140 is respectively formed in each of the recesses R, as shown in FIG. 7. The epitaxial structure 140 may be a silicon germanium epitaxial structure, a silicon carbide epitaxial structure, a silicon phosphorous epitaxial structure or a carbon containing silicon phosphorous epitaxial structure, etc. In this embodiment, epitaxial structure 140 is a silicon germanium epitaxial structure used for forming a PMOS transistor, but is not limited thereto. It should be emphasized that the recesses R1 and R2 of the present invention including the upper tips r12 and r22 in the dual spacer 130 and the lower tips r11 and r21 in the substrate 110, and the upper tips r12 and r22 and the lower tips r11 and r21 are acute angles, so that the epitaxial structures 140 formed in the recesses R all have a W-shaped cross-sectional profile. The epitaxial structures 140 having W-shaped cross-sectional profiles can therefore better induce stresses to the gate channels C than current epitaxial structures (without tips cross-sectional profile), thereby increasing the overall stresses induced by the epitaxial structures 140. In particular, stresses in the gate channels C induced by the epitaxial structures 140 can be increased effectively by the upper tips r12 and r22.

Figure 8:
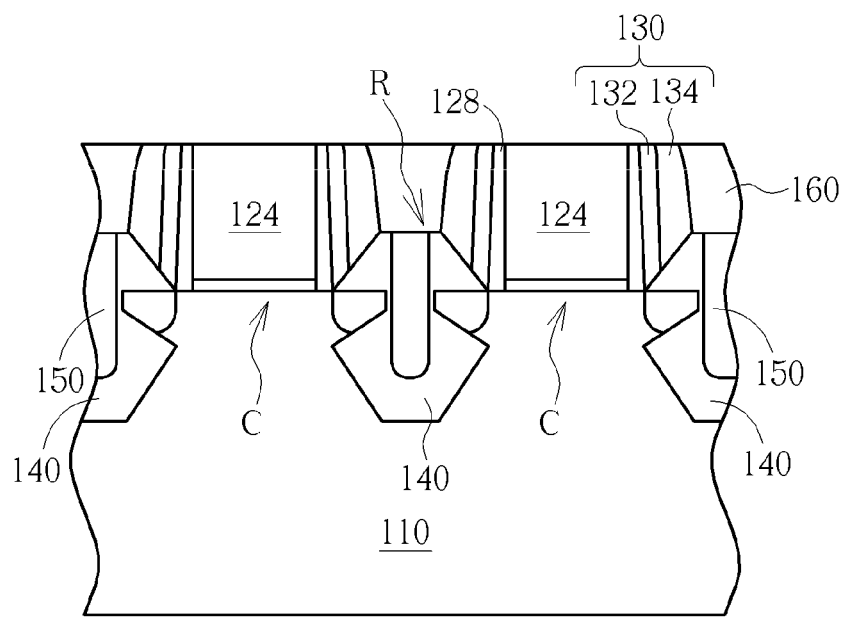
Figure 9:
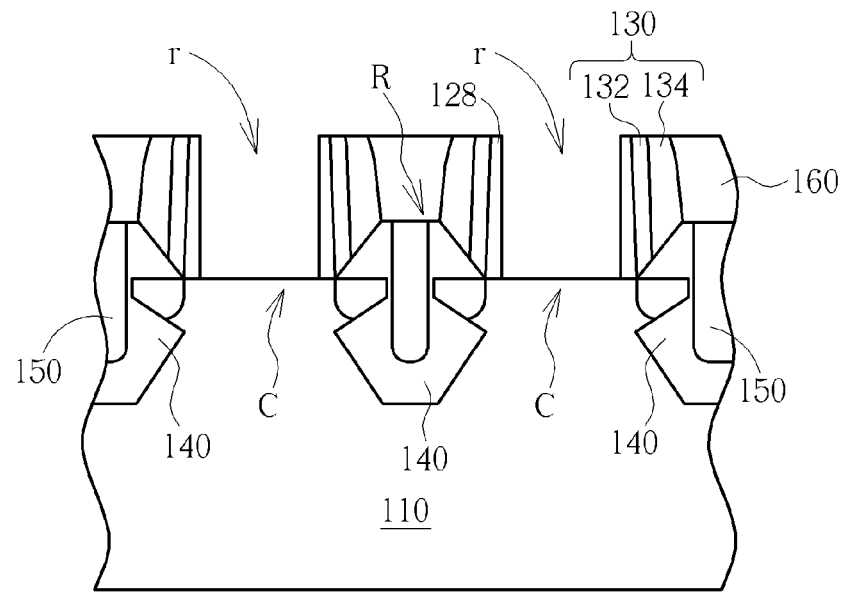

As shown in FIG. 8, a main spacer (not shown) is formed on the substrate 110 beside the dual spacer 130; an ion implantation process is performed to form a source/drain region 150 in the substrate 110 beside the main spacer (not shown). The main spacer (not shown) may be removed. The main spacer (not shown) may be a single layer or a multilayer structure composed of materials such as silicon nitride or silicon oxide etc. The dopants of the source/drain region 150 may be trivalent ions or pentavalent ions such as boron or phosphorus, etc., depending upon the electrical type of the formed semiconductor component; for example, a PMOS transistor is formed in this embodiment, so the dopants may include trivalent ions such as boron. In this embodiment, the epitaxial structures 140 are formed and then the source/drain 150 is formed; in another embodiment, the source/drain 150 is formed and the epitaxial structures 140 are formed. The source/drain 150 and the epitaxial structures 140 may be formed simultaneously. Thereafter, a contact etch stop layer (CESL) (not shown) and an interdielectric layer (not shown) are sequentially formed to cover the substrate 110; a planarization process is performed to planarize the interdielectric layer (not shown) and the contact etch stop layer (CESL) (not shown) and remove the cap layer 126 at the same time, so that a planarized interdielectric layer 160 is formed and the sacrificial electrode layer 124 is exposed. The planarized interdielectric layer 160 may be an oxide layer, but it is not limited thereto. The sacrificial electrode layer 124 and the gate dielectric layer 122 are removed and the substrate 110 is exposed as shown in FIG. 9.

Figure 10:
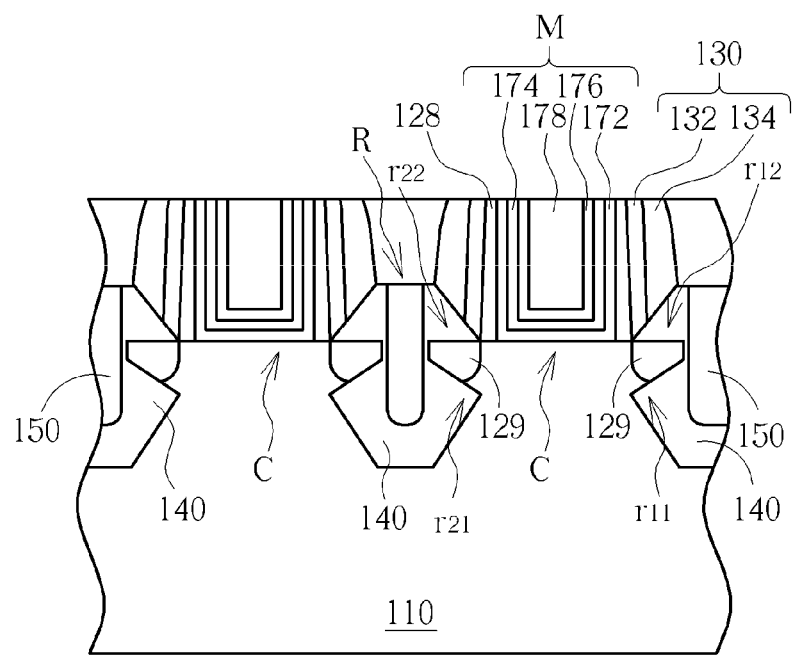

As shown in FIG. 10, a buffer layer (not shown), a gate dielectric layer having a high dielectric constant (not shown), a bottom barrier layer (not shown), a work function metal layer (not shown), a top barrier layer (not shown) and a low resistivity material (not shown) are sequentially formed to cover the substrate 110 and the planarized interdielectric layer 160 and then planarized until the planarized interdielectric layer 160 is exposed, so that a buffer layer 172, a gate dielectric layer having a high dielectric constant 174, a bottom barrier layer (not shown), a work function metal layer 176, a top barrier layer (not shown) and a low resistivity material 178 are formed and constitute metal gates M.

To summarize, the present invention provides a semiconductor structure and process thereof, which forms recesses in a substrate and a dual spacer, wherein each of the recesses has an upper tip in the dual spacer and a lower tip in the substrate, so that stresses in a gate channel induced by epitaxial structures later formed in the recesses can be increased and the efficacy of the epitaxial structures can be improved. Moreover, the upper tips and the lower tips are preferably acute angles, so that the epitaxial structures all have a W-shaped cross-sectional profile, enabling stresses in the gate channel induced by the epitaxial structures to be concentrated; the efficacy of the epitaxial structures can therefore be partially increased. Specially, stresses in the gate channel induced by the epitaxial structures can be increased effectively by the upper tips.

Furthermore, an etching process is performed to form recesses and the etching process may be a single etching process, which forms the upper tips and the lower tips simultaneously, or the etching process may be two or more etching processes, that respectively form parts of the recesses or optimize the shapes or profiles of the recesses by a plurality of etching processes. Preferably, a first etching process is performed to etch the substrate and the lower tips of the recesses in the substrate are formed; then, a second etching process is performed to etch the dual spacer and the upper tips of the recesses in the dual spacer are formed, so that the etchants of the first etching process and the second etching process can be chosen in accordance with the materials of the substrate and the dual spacer individually.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a gate located on a substrate;
   a dual spacer located on the substrate beside the gate; and
   two recesses located in the substrate and the dual spacer,
      wherein the sidewall of each of the recesses next to the gate has a lower tip and an upper tip, and the lower tip is located in the substrate while the upper tip is an acute angle, located in the dual spacer and directly next to the substrate.

2. The semiconductor structure according to claim 1, wherein the dual spacer has an internal spacer and an outer spacer.

3. The semiconductor structure according to claim 2, wherein the internal spacer comprises an oxide spacer and the outer spacer comprises a nitride spacer.

4. The semiconductor structure according to claim 1, further comprising:
   a first spacer located between the gate and the dual spacer.

5. The semiconductor structure according to claim 4, wherein the first spacer comprises a silicon carbon-nitride spacer.

6. The semiconductor structure according to claim 1, wherein the gate comprises a gate dielectric layer having a high dielectric constant.

7. The semiconductor structure according to claim 1, wherein an epitaxial structure is disposed on each of the recesses.

8. The semiconductor structure according to claim 7, wherein the sidewall of the epitaxial structures next to the gate has a W-shaped cross-sectional profile.

9. The semiconductor structure according to claim 1, wherein the lower tip is an acute angle.

10. A semiconductor process, comprising:
    forming a gate on a substrate;
    forming a dual spacer on the substrate beside the gate; and
    performing a first etching process and a second etching process on the substrate and the dual spacer to form two recesses in the substrate and the dual spacer beside the gate, wherein the first etching process is used for etching the substrate beside the dual spacer to form a lower tip of each of the two recesses and the second etching process is used for etching the dual spacer directly next to the substrate to form the upper tip of each of the two recesses, and the upper tip is an acute angle.

11. The semiconductor process according to claim 10, wherein the step of forming the dual spacer comprises:
    entirely covering an internal spacer material and an outer spacer material; and
    etching the internal spacer material and the outer spacer material to form an internal spacer and an outer spacer of the dual spacer.

12. The semiconductor process according to claim 11, wherein the internal spacer comprises an oxide spacer and the outer spacer comprises a nitride spacer.

13. The semiconductor process according to claim 11, wherein the internal spacer has an L-shaped cross-sectional profile.

14. The semiconductor process according to claim 11, wherein the etching rate of the second etching process with respect to the internal spacer is larger than with respect to the outer spacer.

15. The semiconductor process according to claim 11, wherein the etching rate of the second etching process with respect to the internal spacer is larger than to the substrate.

16. The semiconductor process according to claim 11, further comprising:
   forming a first spacer on the substrate beside the gate after the gate is formed.

17. The semiconductor process according to claim 16, wherein the etching rate of the second etching process with respect to the internal spacer is larger than to the first spacer.

18. The semiconductor process according to claim 10, further comprising:
   respectively forming an epitaxial structure in each of the two recesses after the two recesses are formed.

19. The semiconductor process according to claim 18, wherein the sidewall of each of the epitaxial structures next to the gate has a W-shaped cross-sectional profile.

20. The semiconductor process according to claim 10, wherein the first etching process comprises a dry etching process or a wet etching process, and the second etching process comprises a wet etching process.

* * * * *